(12) United States Patent
Zhao

(10) Patent No.: US 9,543,832 B2
(45) Date of Patent: Jan. 10, 2017

(54) CURRENT DETECTION CIRCUIT AND SWITCHING REGULATOR THEREOF

(71) Applicant: Silergy Semiconductor Technology (Hangzhou) LTD, Hangzhou, ZheJiang Province (CN)

(72) Inventor: Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 222 days.

(21) Appl. No.: 14/230,103

(22) Filed: Mar. 31, 2014

(65) Prior Publication Data

US 2014/0306677 A1   Oct. 16, 2014

(30) Foreign Application Priority Data

Apr. 12, 2013 (CN) .......................... 2013 1 0129583

(51) Int. Cl.
| H02M 3/156 | (2006.01) |
| H02M 3/155 | (2006.01) |
| G01R 19/00 | (2006.01) |
| H02M 1/00 | (2006.01) |

(52) U.S. Cl.
CPC .......... *H02M 3/156* (2013.01); *G01R 19/0092* (2013.01); *H02M 3/155* (2013.01); *H02M 2001/0009* (2013.01)

(58) Field of Classification Search
CPC ................ G05F 1/00; G05F 1/10; G05F 1/12; G05F 1/46; G05F 1/455; G05F 1/445; G05F 1/66; G05F 1/40; G05F 1/42; G05F 1/462; G05F 1/52; G05F 1/56; G05F 1/575; G05F 1/465; G05F 1/468; G05F 1/562; G05F 1/565; G05F 1/567; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 2001/0045; H02M 3/156; H02M 3/158; H02M 3/1588; H02M 2003/1566; H02M 3/1582; H02M 2003/1557; H02M 3/157; H02M 2001/0012; H02M 3/1563; H02M 2001/0009; H05B 39/048; B23K 11/24; H04B 2215/069

See application file for complete search history.

(56) References Cited

U.S. PATENT DOCUMENTS

| 6,501,322 B1 * | 12/2002 | Bidenbach ............. G06G 7/186 327/336 |
| 6,856,102 B1 * | 2/2005 | Lin ..................... H05B 41/2886 315/209 R |
| 8,129,970 B2 | 3/2012 | Nishida |

(Continued)

FOREIGN PATENT DOCUMENTS

CN   102457187 A   5/2012

*Primary Examiner* — Jeffrey Gblende
(74) *Attorney, Agent, or Firm* — Michael C. Stephens, Jr.

(57) ABSTRACT

In one embodiment, a current detection circuit configured for a switching regulator can include: (i) a feedback controlling circuit configured to control a feedback signal to be consistent with a reference signal, and to generate a feedback control signal; and (ii) a feedback signal generator configured to receive a rise time and a fall time of inductor current of the switching regulator, and to generate the feedback signal in direct proportion with the feedback control signal.

20 Claims, 10 Drawing Sheets

(56) References Cited

U.S. PATENT DOCUMENTS

| | | | |
|---|---|---|---|
| 2007/0145965 A1* | 6/2007 | Oswald | H02M 3/1563 323/286 |
| 2007/0236971 A1* | 10/2007 | Chen | H02M 3/1588 363/56.01 |
| 2009/0315527 A1 | 12/2009 | Kung et al. | |
| 2011/0267015 A1 | 11/2011 | Lu et al. | |
| 2012/0038341 A1* | 2/2012 | Michishita | H02M 3/158 323/284 |
| 2012/0308218 A1* | 12/2012 | Galloway | H02M 3/156 396/206 |

* cited by examiner

US 9,543,832 B2

CURRENT DETECTION CIRCUIT AND SWITCHING REGULATOR THEREOF

RELATED APPLICATIONS

This application claims the benefit of Chinese Patent Application No. 201310129583.3, filed on Apr. 12, 2013, which is incorporated herein by reference in its entirety.

FIELD OF THE INVENTION

The present invention generally relates to the field of power supplies, and more particularly to current detection circuits in switching regulators, and associated switching regulators.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. In this way, the output voltage and/or the output current of the switching power supply can be maintained as substantially constant. Therefore, the selection and design of the particular control circuitry and approach is very important to the overall performance of the switching power supply. Thus, using different detection signals and/or control circuits can result in different control effects on power supply performance.

SUMMARY

In one embodiment, a current detection circuit configured for a switching regulator can include: (i) a feedback controlling circuit configured to control a feedback signal to be consistent with a reference signal, and to generate a feedback control signal; and (ii) a feedback signal generator configured to receive a rise time and a fall time of inductor current of the switching regulator, and to generate the feedback signal in direct proportion with the feedback control signal.

In one embodiment, a switching regulator can include: (i) an input current detection circuit coupled to an input of a power stage of the switching regulator, and configured to obtain an input current of the switching regulator; (ii) a current detection circuit configured to receive the input current, and to generate a detection signal that is in direct proportion with an output current of the switching regulator; (iii) a constant output current controlling circuit configured to generate a current control signal based on the detection signal and a reference signal that represents an expected output current of the switching regulator; and (iv) a logic and driving circuit configured to drive power switches of the power stage in accordance with the current control signal to maintain the output current consistent with the expected output current.

In one embodiment, a switching regulator can include: (i) an output current detection circuit coupled to an output of a power stage of the switching regulator, and configured to obtain an output current of the switching regulator; (ii) a current detection circuit configured to receive the output current, and to generate a detection signal that is in direct proportion with an input current of the switching regulator; (iii) a constant output current controlling circuit configured to generate a current control signal based on the output current and a reference signal that represents an expected output current of the switching regulator; (iv) an input current limitation circuit configured to receive the detection signal and a current limitation signal, and to activate a limitation control signal when the input current is higher than the current limitation signal; and (v) a logic and driving circuit configured to drive power switches of the power stage in accordance with the current control signal to maintain the output current consistent with the expected output current, and to turn off the power switches in response to activation of the limitation control signal.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Switching regulators may be employed to provide stable voltage sources and/or current sources for various electronic systems and circuits. A switching regulator can generate an output voltage and/or output current by converting an input DC voltage into a high frequency voltage, and then filtering the high frequency voltage to generate an output DC voltage or output DC current. Specifically, the switching regulator can include a power switch for alternately coupling and decoupling an input DC voltage source (e.g., a battery) to a load. An output filter, typically including an inductor and a capacitor, may be coupled between the input voltage source and the load in order to filter the output of the power switch, and thus provide the output DC voltage. A controller (e.g., a pulse-width modulator [PWM], a pulse frequency modulator, etc.) can control operation of the power switch (e.g., on/off states of transistors) in accordance with the output signal, to maintain a substantially constant output DC voltage or output DC current.

In order to achieve precise control of the output current of a switching regulator, the output current may be sampled in order to obtain output current information that can be used to control and maintain the output current at substantially constant through a current control loop. For example, the voltage of a resistor coupled in series with the output current loop or a parasitic direct current resistor (RDR) of the inductor can be representative of such output current information.

Figure 1A:
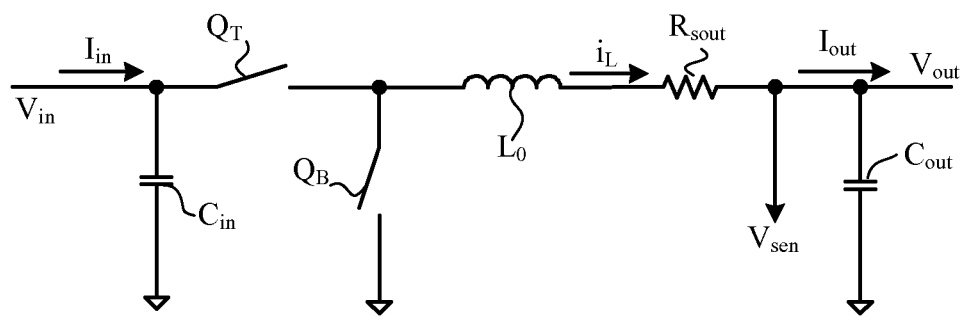
FIG. 1A is a schematic diagram of a first example current detection circuit for detecting the output current of a switching regulator.

Referring now to FIG. 1A, shown is a schematic diagram of a first example current detection circuit for detecting the output current of a switching regulator. In this example, power switch $Q_T$, power switch $Q_B$, output inductor $L_0$, and output capacitor $C_{out}$ can form a buck topology. Output current $I_{out}$ may be equal to an average of inductor current $i_L$ flowing through output inductor $L_0$. Resistor $R_{sout}$ can connect in series with output inductor $L_0$ to detect inductor current $i_L$ to generate detection signal $V_{sen}$. Detection signal $V_{sen}$ can then be averaged to generate output current information. In this way, output current can be detected accurately; however, the sampling of the inductor current can cause limitations in integrated circuit design.

Figure 1B:
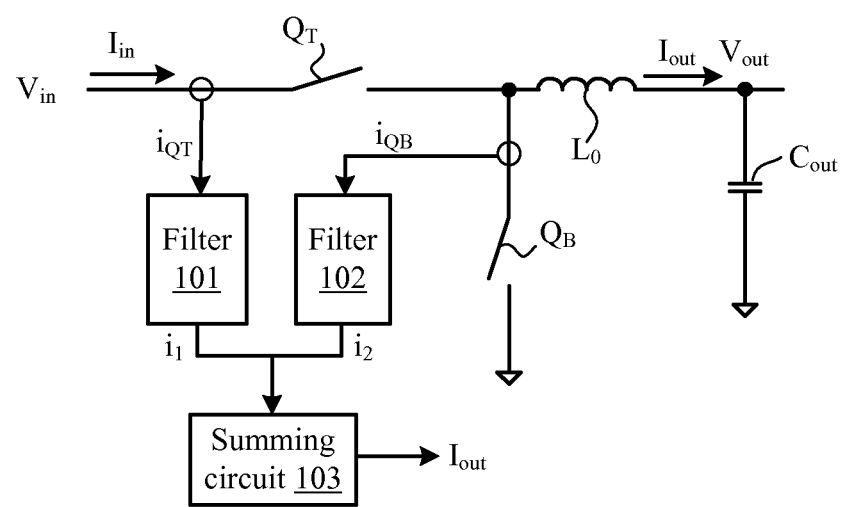
FIG. 1B is a schematic block diagram of a second example current detection circuit for detecting the output current of a switching regulator.

Referring now to FIG. 1B, shown is a schematic block diagram of a second example current detection circuit for detecting the output current of a switching regulator. In this example, the switching regulator may also be configured as a buck topology, and output current $I_{out}$ can be a summation of an average of current flowing through main power switch $Q_T$ and an average of current flowing through synchronous power switch $Q_B$, or a synchronous diode. Current $i_{QT}$ flowing through main power switch $Q_T$ can be sampled and filtered by filter 101 to generate average current $i_1$. Similarly, current $i_{QB}$ flowing through synchronous power switch $Q_B$ can be sampled and filtered by filter 102 to generate average current $i_2$. Output current $I_{out}$ can be generated by summing average current $i_1$ and average current $i_2$ through summing circuit 103. The current sample can be operated by sampling current flowing through the power switches in this configuration, which may facilitate the design of integrated circuits. However, the chip size may suffer due to utilizing two current sampling circuits in this approach. Further, additional periphery components may be necessary in order to implement two filters with sufficiently large time constants, as well as a summing circuit.

In one embodiment, a current detection circuit configured for a switching regulator can include: (i) a feedback controlling circuit configured to control a feedback signal to be consistent with a reference signal, and to generate a feedback control signal; and (ii) a feedback signal generator configured to receive a rise time and a fall time of inductor current of the switching regulator, and to generate the feedback signal in direct proportion with the feedback control signal.

Figure 2A:
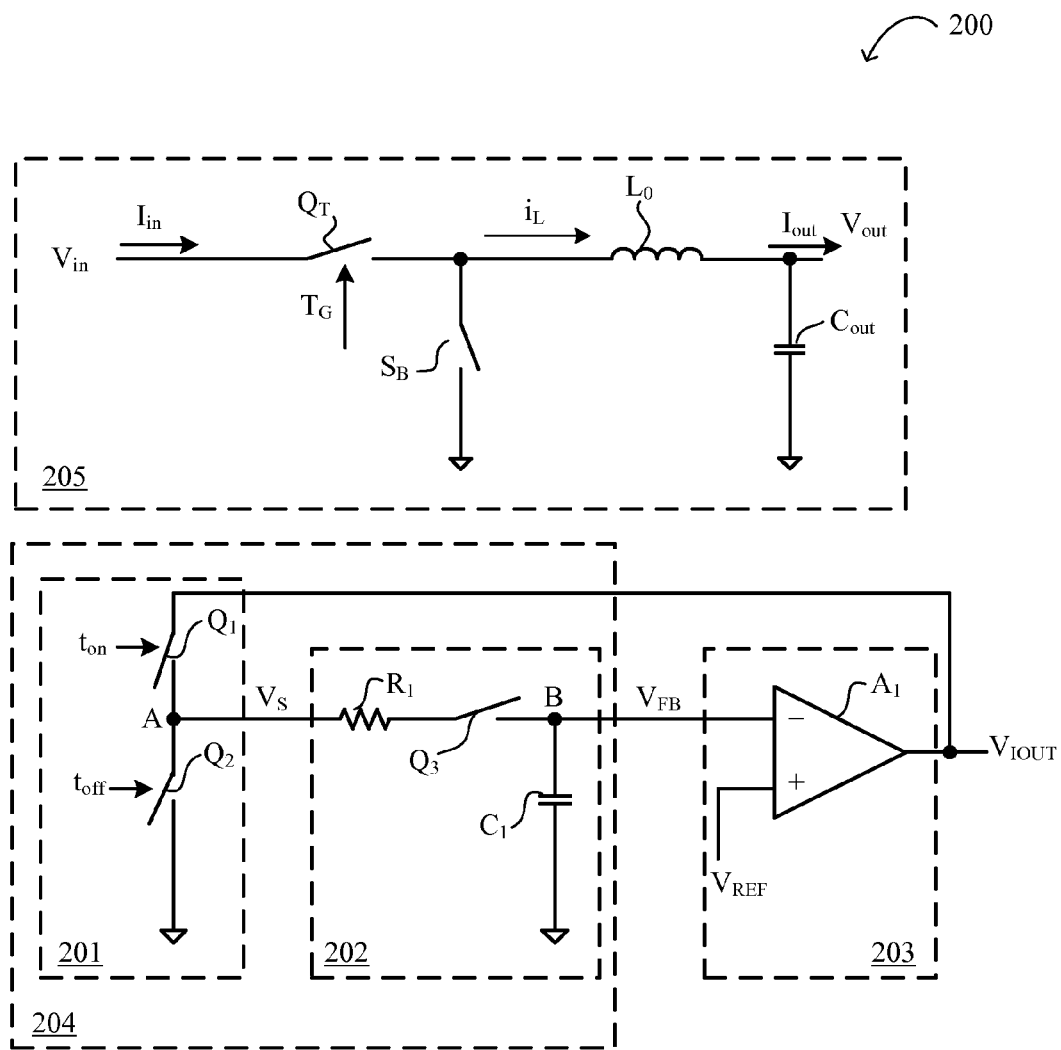
FIG. 2A is a schematic block diagram of a first example current detection circuit applied in a switching regulator, in accordance with the embodiments of the present invention.

Referring now to FIG. 2A, shown is a schematic block diagram of a first example current detection circuit applied in a switching regulator, in accordance with the embodiments of the present invention. Switching regulator 200 and this example can include a power stage and a current detection circuit. For example, the power stage of the switching regulator can be configured as buck topology; however, any suitable converter topology (e.g., flyback, boost, SEPIC, etc.) can be employed in particular embodiments. Main power switch $Q_T$, rectifier switch $S_B$, output inductor $L_0$, and output capacitor $C_{out}$ can form buck power stage 205. Buck power stage 205 can be synchronous if rectifier switch $S_B$ is configured as a controllable switch, or be non-synchronous if rectifier switch $S_B$ is configured as a diode. In this way, both synchronous and non-synchronous topologies can be supported in particular embodiments.

In this example, an output current of buck power stage 205 may not be directly sampled by a current detection circuit, but rather can be obtained in an indirect fashion by a sensing signal in accordance with input current $I_{in}$, of buck power stage 205. Specifically, the current detection circuit in this example can include feedback signal generator 204 including switching circuit 201 and filtering circuit 202, as well as feedback controlling circuit 203. Feedback control signal $V_{IOUT}$ from feedback controlling circuit 203 can be configured as a sensing signal, and the output of the current detection circuit, and may represent output current information of the switching regulator.

Feedback signal generator 204 can receive feedback control signal $V_{IOUT}$ from feedback controlling circuit 203, as well as signals that represent rise time $t_{on}$ and fall time $t_{off}$ of inductor current $i_L$ of buck power stage 205, to generate feedback signal $V_{FB}$. Feedback controlling circuit 203 can control and/or maintain feedback signal $V_{FB}$ to be consistent with (e.g., a same level as, directly proportional to, etc.) reference signal $V_{REF}$ that represents input current $I_{in}$, of buck power stage 205. Reference signal $V_{REF}$ can be generated by any suitable voltage reference generation approach. Also, feedback control signal $V_{IOUT}$ from feedback controlling circuit 203 can be maintained through feedback control to be representative of output current $I_{out}$.

For example, switching circuit 201 (e.g., including two transistors) can receive feedback control signal $V_{IOUT}$ from feedback controlling circuit 203, and can generate square wave signal $V_S$ based on a ratio between rise time $t_{on}$ and fall time $t_{off}$ of inductor current $i_L$. In particular, control signals that indicate rise time $t_{on}$ and fall time $t_{off}$ can be used to control on and off times of switches (e.g., transistors) $Q_1$ and $Q_2$, in order to generate square wave signal $V_S$. Square wave signal $V_S$ can also be filtered by filtering circuit 202 in order to generate feedback signal $V_{FB}$.

FIG. 2A shows very particular examples of switching circuit 201, filtering circuit 202, and feedback controlling circuit 203. For example, switching circuit 201 can include switches $Q_1$ and $Q_2$ coupled in series between an output node (e.g., feedback control signal $V_{IOUT}$) of feedback controlling circuit 203 and ground. Further, a signal at common node A of switching circuit 201 can be configured as square wave signal $V_S$. During each switching cycle, a turn-on time of switch $Q_1$ may be substantially the same as rise time $t_{on}$ of inductor current $i_L$, and the turn-on time of switch $Q_2$ may be substantially the same as fall time $t_{off}$ of inductor current $i_L$.

Filtering circuit 202 can include resistor $R_1$ and capacitor $C_1$ coupled in series between common node A and ground, and a signal at common node B can be configured as feedback signal $V_{FB}$. In this example, feedback controlling circuit 203 can include amplifier $A_1$ (e.g., an operational amplifier). The non-inverting terminal of amplifier $A_1$ can receive reference signal $V_{REF}$, the inverting terminal can receive feedback signal $V_{FB}$, and the output of amplifier $A_1$ can configured as feedback control signal $V_{IOUT}$ of the current detection circuit.

Example operation of the current detection circuit of FIG. 2A will be described in combination with operation waveforms of different operation modes shown in FIGS. 2B and 2C. Input current can be the average value of switching current $I_Q$ flowing through main power switch $Q_T$. When main power switch $Q_T$ is turned on, switching current $I_Q$ can be consistent with inductor current $i_L$. Input current $I_{in}$ can be the average value of the rising portion of inductor current $i_L$. Output current $I_{out}$ can be the average value of a portion of inductor current $i_L$ that includes the rising and falling portions, the value of which is not zero. Therefore, they ratio between output current $I_{out}$ and input current $I_{in}$, can be consistent with a ratio between rise time $t_{on}$ and the summation of both rise time $t_{on}$ and fall time $t_{off}$.

Figure 2B:
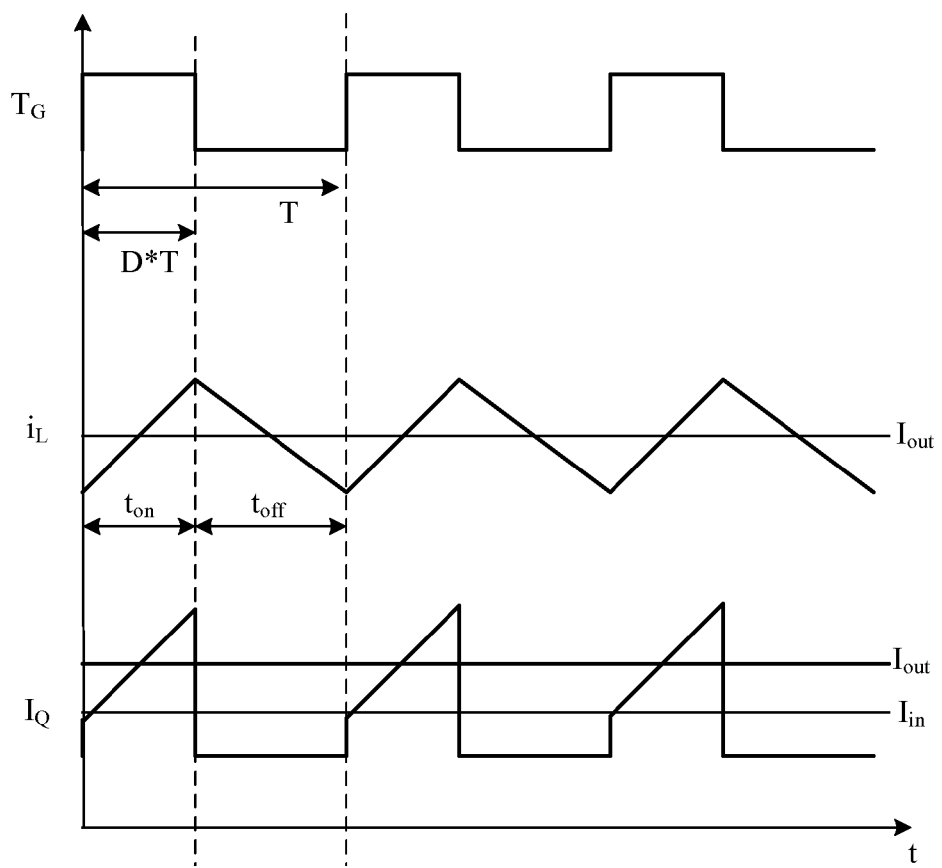
FIG. 2B is a waveform diagram showing example operation of the current detection circuit of FIG. 2A in a continuous inductor current mode (CCM), in accordance with the embodiments of the present invention.

Referring now to FIG. 2B, shown is a waveform diagram of example operation of the current detection circuit of FIG. 2A in a continuous inductor current mode (CCM), in accordance with the embodiments of the present invention. During each switching cycle T, when main power switch $Q_T$ is turned on, inductor current $i_L$ can linearly increase, and the on time of main power switch $Q_T$ can be consistent with rise time $t_{on}$ of inductor current $i_L$. When main power switch $Q_T$ is turned off, inductor current $i_L$ can linearly decrease, and the off time of main power switch $Q_T$ can be consistent with fall time $t_{off}$ of inductor current $i_L$. The on and off states of switch $Q_1$ of switching circuit 201 can be controlled by controlling signal $T_G$ (e.g., the gate control) of main power switch QT to maintain consistency of on and off states with main power switch $Q_T$, while the on and off state of switch $Q_2$ of switching circuit 201 can be controlled by an inverted version of controlling signal $T_G$ to maintain opposite on and off states of those switches relative to main power switch $Q_T$.

Based on the above-mentioned control of switching circuit 201, if the on duty cycle of main power switch $Q_T$ is D, feedback signal can be represented as below in formula (1).

$$V_{FB}=V_{IOUT} \times D \qquad (1)$$

Reference signal $V_{REF}$ may be proportional with input current and can be represented as below in formula (2).

$$V_{REF}=I_{in} \times k_2 \qquad (2)$$

For example, $k_2$ can represent a proportionality coefficient between input current $I_{in}$, and reference signal $V_{REF}$. In accordance with "virtual short" principles of operational amplifiers, reference signal $V_{REF}$ and feedback signal $V_{FB}$ input to operational amplifier $A_1$ may be identical. Thus, formula (3) can be derived from formula (1) and formula (2), as shown below.

$$V_{IOUT} \times D = I_{in} k_2 \qquad (3)$$

In accordance with buck topology operating principles, when inductor current $i_L$ is operated in a non-continuous mode, including continuous boundary modes of operation, the relationship between input current $I_{in}$, and output current $I_{out}$ can be indicated as shown below in formula (4).

$$I_{in}=D \times I_{out} \qquad (4)$$

Formula (5) can then be derived from formulas (3) and (4), as shown below.

$$V_{IOUT}=I_{out} \times k_2 \qquad (5)$$

Feedback control signal $V_{IOUT}$ can be in proportion to output current $I_{out}$. Further, detection of output current $I_{out}$ can be achieved by feedback control signal $V_{IOUT}$ that represents an output signal of the example current detection circuit of FIG. 2A. Also, when the switching regulator is operated in CCM or boundary inductor current mode (BCM) as shown in FIG. 2B, rise time $t_{on}$ and fall time $t_{off}$ of inductor current $i_L$ can be represented by a duty cycle of main power switch $Q_T$ of the power stage. Thus, the power stage can be a synchronous or a non-synchronous topology in particular embodiments.

Figure 2C:
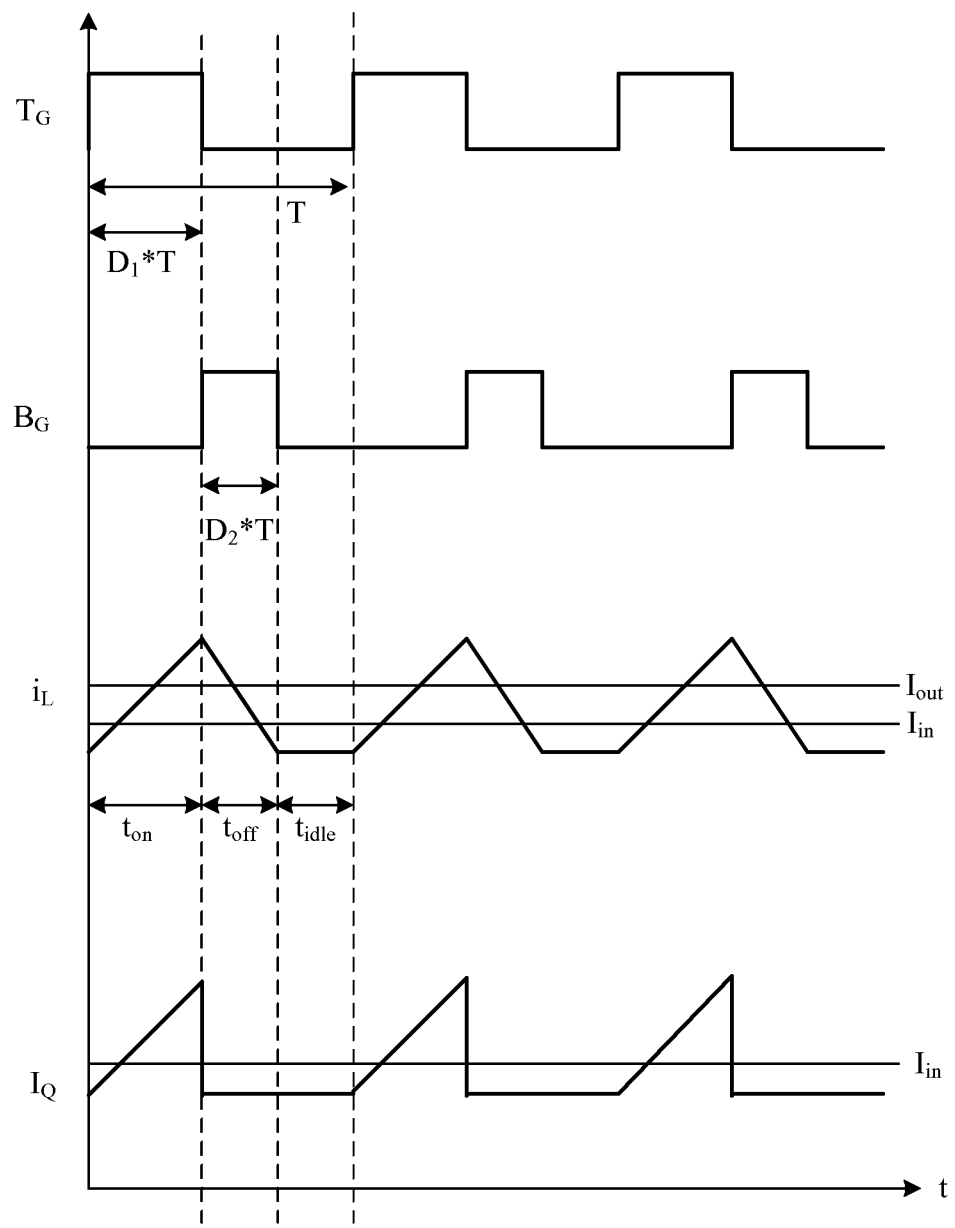
FIG. 2C is a waveform diagram showing example operation of the current detection circuit of FIG. 2A in a discontinuous inductor current mode (DCM), in accordance with the embodiments of the present invention.

Referring now to FIG. 2C, shown is a waveform diagram showing example operation of the current detection circuit of FIG. 2A in a discontinuous inductor current mode (DCM), in accordance with the embodiments of the present invention. Input current $I_{in}$, and output current $I_{out}$ may not match the relationship of formula (4) in this particular operation mode. Rise time $t_{on}$ and fall time $t_{off}$ of inductor current $i_L$ may not be represented by the duty cycle of main power switch $Q_T$ in this particular case. When switch $S_B$ is configured as a controllable synchronous power switch (e.g., a transistor), buck power stage 205 can be configured as a synchronous topology. In this case, rise time $t_{on}$ of inductor current $i_L$ can be consistent with the on time of main power switch $Q_T$, and fall time $t_{off}$ of inductor current $i_L$ can be consistent with the on time of synchronous power switch $S_B$. The on and off states of switch $Q_1$ of switching circuit 201 can be controlled by controlling signal $T_G$ of main power switch $Q_T$, while the on and off states of switch $Q_2$ can controlled by controlling signal $B_G$ (e.g., a gate control signal) of synchronous power switch $S_B$.

During idle time $t_{idle}$ when both main power switch $Q_T$ and synchronous power switch $S_B$ are off, inductor current $i_L$ can be maintained as zero. If the switch impendence of main power switch $Q_T$ and synchronous power switch $S_B$ are sufficiently large, capacitor $C_1$ may not discharge, thus maintaining the energy of capacitor $C_1$. On the contrary, if the switch impendence of main power switch $Q_T$ and synchronous power switch $S_B$ are not sufficiently large, switch $Q_3$ can be coupled between resistor $R_1$ and capacitor $C_1$ to prevent capacitor $C_1$ from discharging in this case. During idle time $t_{idle}$, the discharge path may be cut off to maintain the storage energy of capacitor $C_1$.

In this way, controlling signals of switch $Q_1$ and switch $Q_2$ can be set or otherwise configured in accordance with the particular inductor current operation mode, as well as the type of the power stage topology of the switching regulator. When operating in CCM as shown in FIG. 2B, because the rise and fall times of the inductor current are consistent with the corresponding on and off times of the main power switch, controlling signals of switches $Q_1$ and $Q_2$ can essentially be the controlling signal of the main power switch and its inverted version.

When operating in DCM as shown in FIG. 2C, because the rise and fall times of the inductor current are consistent with the on time of the main power switch and the on time of the synchronous power switch, the controlling signals of switches $Q_1$ and $Q_2$ can essentially be the controlling signal of the main power switch and the controlling signal of the synchronous power switch. For example, the switching regulator can be configured in a synchronous topology, and the synchronous power switch can be configured as controllable transistor.

Figure 3:
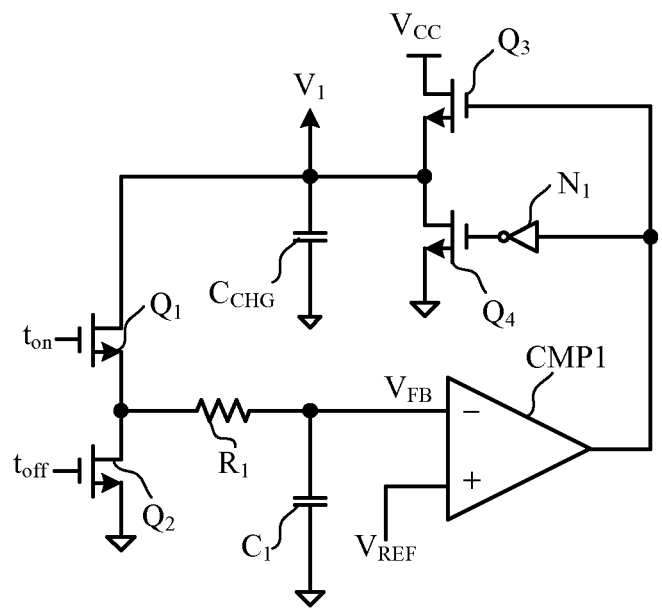
FIG. 3 is a schematic block diagram of a second example current detection circuit applied in a switching regulator, in accordance with embodiments of the present invention.

Referring now to FIG. 3, shown is a schematic block diagram of a second example current detection circuit applied in a switching regulator, in accordance with embodiments of the present invention. Here, the switching regulator is configured in a buck topology. In this example, the feedback controlling circuit can include comparator CMP1 and a switching circuit including transistors $Q_3$ and $Q_4$. Comparator CMP1 can compare reference signal $V_{REF}$ against feedback signal $V_{FB}$ to control on and off states of transistors $Q_3$ and $Q_4$ based on the comparison result. The charging and discharging operations of capacitor $C_{CHG}$ can be controlled by the switching circuit in order to maintain voltage $V_1$, the output signal of the current detection circuit, across capacitor $C_{CHG}$ as substantially constant.

Specifically, the input terminal of the feedback signal generator can be coupled to capacitor $C_{CHG}$ to receive voltage $V_1$. Feedback signal $V_{FB}$ can be generated by the switching circuit including transistors $Q_1$ and $Q_2$, and the filtering circuit (e.g., including resistor $R_1$ and capacitor $C_1$). Also, reference signal $V_{REF}$ can be in proportion with input current $I_{in}$. When feedback signal $V_{FB}$ is higher than reference signal $V_{REF}$, capacitor $C_{CHG}$ can be discharged through transistor $Q_4$ to release the energy of capacitor $C_{CHG}$, and voltage $V_1$ can accordingly decrease. On the contrary, when feedback signal $V_{FB}$ is lower than reference signal $V_{REF}$, capacitor $C_{CHG}$ can be charged via transistor $Q_3$ by voltage source $V_{CC}$, and voltage $V_1$ can accordingly increase. Similar to the example of FIG. 2A, the ratio between feedback signal $V_{FB}$ and voltage $V_1$ can be maintained as consistent with the ratio between the output current and the input current of the switching regulator, as determined by the type of the power stage. Voltage $V_1$ may be in proportion with output current $I_{out}$ to achieve detection of the output current.

While current detection circuits have been described herein in accordance with buck topology examples, those skilled in the art will recognize that other suitable circuits can be utilized to achieve feedback signal generation and feedback controlling functions. For example, in the current detection circuit of FIG. 3, a voltage controlled current source can be employed to receive the output signal of comparator CMP1, and current from the voltage controlled current source can control charging and discharging operation of capacitor $C_{CHG}$ to regulate voltage $V_1$ across capacitor $C_{CHG}$.

Figure 4A:
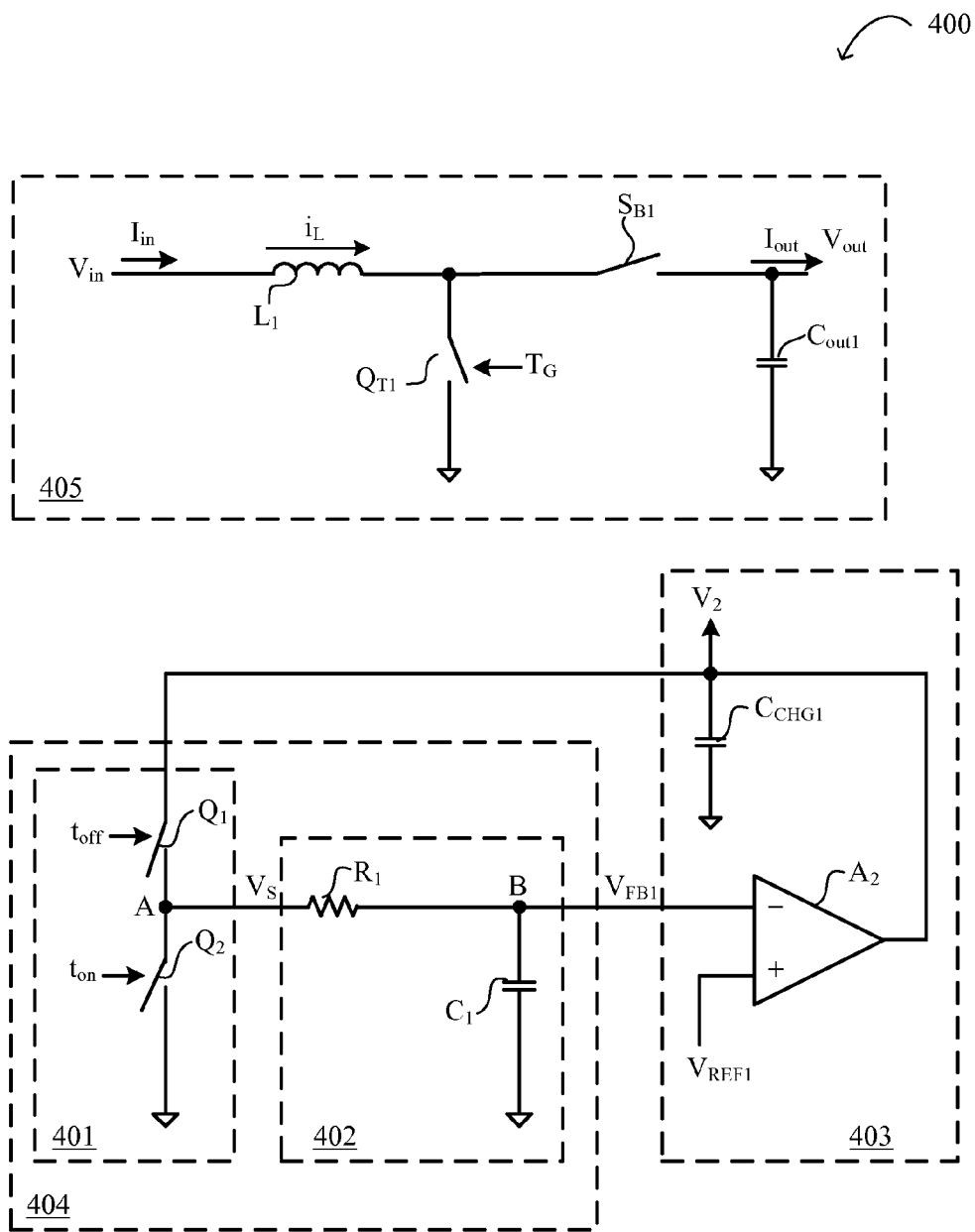
FIG. 4A is a schematic block diagram of a third example current detection circuit applied in a switching regulator, in accordance with embodiments of the present invention.

Referring now to FIG. 4A, shown is a schematic block diagram of a third example current detection circuit applied in a switching regulator, in accordance with embodiments of the present invention. In this example, main power switch $Q_{T1}$, synchronous switch $S_{B1}$, input inductor $L_1$, and output capacitor $C_{out1}$ can form boost power stage 405. For example, boost power stage 405 can be synchronous or non-synchronous, and synchronous switch $S_{B1}$ can be a controllable switch (e.g., an LDMOS transistor, a bipolar transistor, etc.) in the synchronous case, or a diode in the non-synchronous case.

In this example, the input current of boost power stage 405 may not be directly sampled by the current detection circuit, but rather a detection signal representative of input current $I_{in}$ of boost power stage 405 can be indirectly generated in accordance with output current $I_{out}$ of boost power stage 405. For example, feedback controlling circuit 403 can include transconductance amplifier $A_2$ and charging capacitor $C_{CHG1}$. The non-inverting terminal of transconductance amplifier $A_2$ can receive reference signal $V_{REF1}$ that is in direct proportion with output current $I_{out}$, while the inverting terminal of transconductance amplifier $A_2$ can receive feedback signal $V_{FB1}$ output by feedback signal generator 404.

Charging capacitor $C_{CHG1}$ can be coupled between an output of transconductance amplifier $A_2$ and ground, and voltage $V_2$ across capacitor $C_{CHG1}$ can be configured as the output signal of the current detection circuit. When reference signal $V_{REF1}$ is higher than feedback signal $V_{FB1}$, charging capacitor $C_{CHG1}$ can be charged by the output current at the output of transconductance amplifier $A_2$, and voltage $V_2$ can accordingly increase. On the contrary, when reference signal $V_{REF1}$ is lower than feedback signal $V_{FB1}$, charging capacitor $C_{CHG1}$ can be discharged via transconductance amplifier $A_2$, and voltage $V_2$ can accordingly decrease. Voltage $V_2$ can be maintained as substantially constant through such feedback control.

Feedback signal generator 404 can include switching circuit 401 and filtering circuit 402, where the implementation and operating principles of which are similar to the example of FIG. 2A. However, in this particular example, during each switching cycle, the on time of switch $Q_1$ can be consistent with fall time $t_{off}$ of inductor current $i_L$, and the on time of switch $Q_2$ can be consistent with rise time $t_{on}$ of inductor current $i_L$.

Figure 4B:
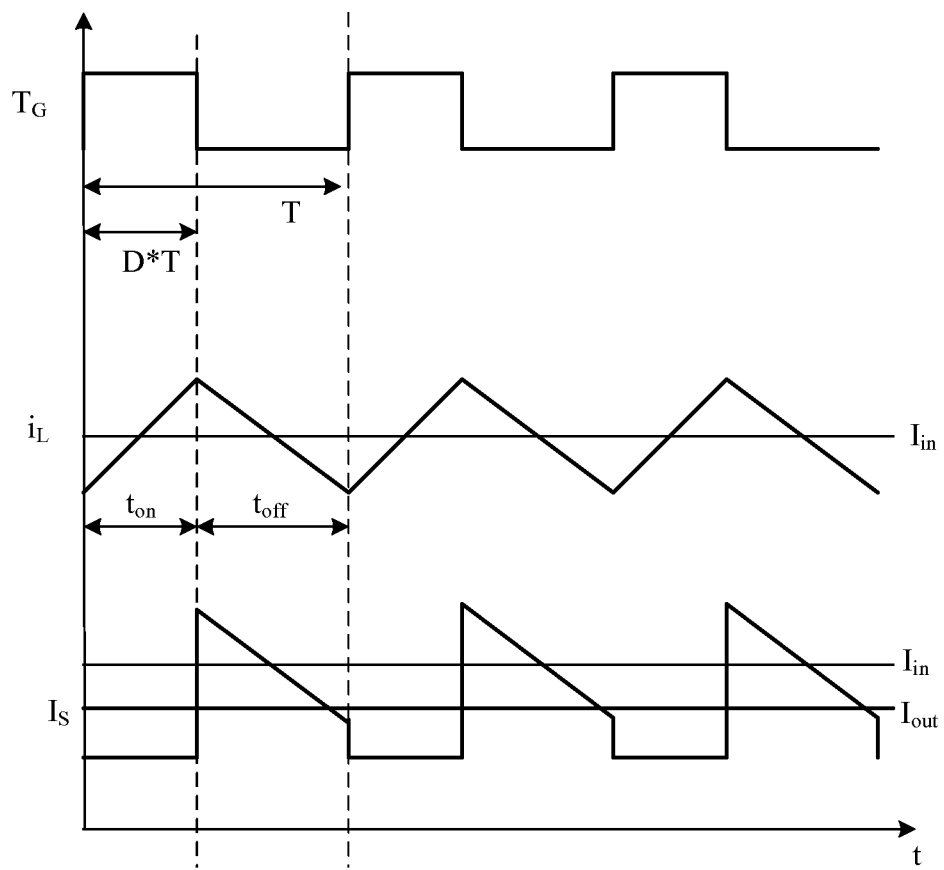
FIG. 4B is a waveform diagram showing example operation of the current detection circuit applied in a switching regulator of FIG. 4A, in accordance with embodiments of the present invention.

Referring now to FIG. 4B, shown is a waveform diagram showing example operation of the current detection circuit applied in a switching regulator of FIG. 4A, in accordance with embodiments of the present invention. When inductor current $i_L$ operates in a continuous mode, input current $I_{in}$, can be an average value of inductor current $i_L$, and output current $I_{out}$, can be an average value of current $I_S$ flowing through synchronous switch $S_{B1}$, which may also be an average value of the portion of inductor current $i_L$ of fall time. Rise time $t_{on}$ of inductor current $i_L$ can be represented as the on time of main power switch $Q_{T1}$, that can be the product of on duty cycle D and switching cycle T. Fall time $t_{off}$ of inductor current $i_L$ can be represented as the off time of main power switch $Q_{T1}$, that can be the product of off duty cycle (1−D) and switching cycle T. Therefore, the on and off state of switch $Q_1$ can be controlled by an inverted version of controlling signal $T_G$ of main power switch $Q_{T1}$ and the on and off states of switch $Q_2$ can be controlled by controlling signal $T_G$ of main power switch $Q_{T1}$.

The relationship among voltage $V_1$, feedback signal $V_{FB1}$, and reference signal $V_{REF1}$ can be represented in formula (6), as shown below.

$$V_{FB1}=V_1\times(1-D)=V_{REF1}=k_1\times I_{out} \quad (6)$$

For example, $k_1$ can be the proportionality coefficient between reference signal $V_{REF1}$ and output current $I_{out}$. The relationship between input current $I_{in}$, and output current $I_{out}$ can be represented as shown below formula (7), in accordance with operating principles of boost convertor topologies.

$$I_{in}\times(1-D)=I_{out} \quad (7)$$

Formula (8) can be derived by substituting formula (7) into formula (6), as shown below.

$$V_1=k_1\times I_{in} \quad (8)$$

The current detection circuit above may thus only sample the output current to generate a detection signal that is in direct proportion with input current $I_{in}$, (shown in the formulas above as voltage $V_1$). Further, the operation of the circuit of FIG. 4A in a discontinuous inductor current mode of operation can be understood from the description of FIG. 2C, as discussed above. In addition, examples of current detection circuitry corresponding to various switching regulator topologies and inductor current operating modes have also been described above. Those skilled in the art will recognize that other circuit configurations and structures (e.g., feedback signal generator, feedback controlling circuit, etc.) can alternatively or additionally be utilised in particular embodiments.

In one embodiment, a switching regulator can include: (i) an input current detection circuit coupled to an input of a power stage of the switching regulator, and configured to obtain an input current of the switching regulator; (ii) a current detection circuit configured to receive the input current, and to generate a detection signal that is in direct proportion with an output current of the switching regulator; (iii) a constant output current controlling circuit configured to generate a current control signal based on the detection signal and a reference signal that represents an expected output current of the switching regulator; and (iv) a logic and driving circuit configured to drive power switches of the power stage in accordance with the current control signal to maintain the output current consistent with the expected output current.

Figure 5:
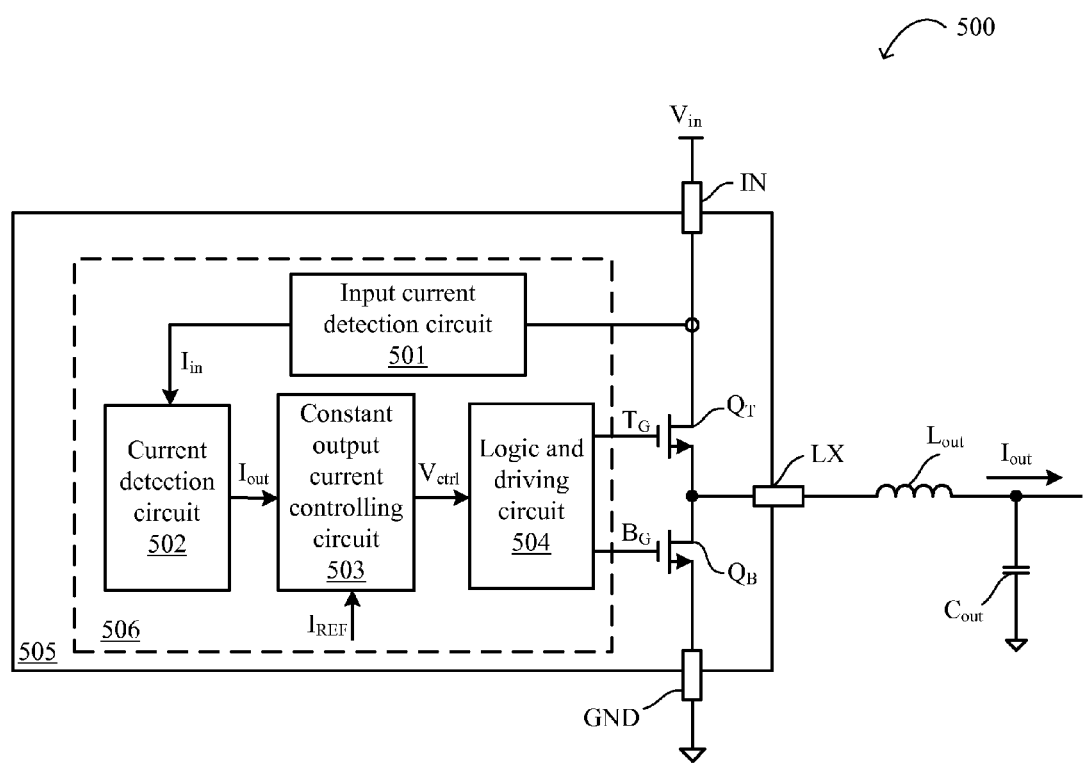
FIG. 5 is a schematic block diagram of a first example switching regulator including an integrated circuit, in accordance with embodiments of the present invention.

Referring now to FIG. 5, shown is a schematic block diagram of a first example switching regulator including an integrated circuit, in accordance with embodiments of the present invention. In this particular example, switching regulator 500 can be configured as a synchronous buck topology, where mean power switch $Q_T$, synchronous power switch $Q_B$, inductor $L_{out}$, and capacitor $C_{out}$ can form a buck power stage.

In order to improve levels of integration, switching power supplies of small and medium power, controlling circuits, power switches, and protection circuits may be integrated into one chip. Thus, no external wires or connections may be necessary to achieve connectivity among controlling circuits, driving circuits, and power switches for such a monolithic regulator, which can decrease associated parasitic resistance and inductance as compared to discrete components. In addition, larger current density can be accommodated by way of lower parasitic resistance and inductance among the functional elements, potentially resulting in higher switching frequency operation and less ripple on the output supply.

In the example of FIG. 5, main power switch $Q_T$, synchronous power switch $Q_B$, and controlling circuit 506 can be integrated into single chip 505, which can include pin IN, pin GND, and pin LX for providing external connection to chip 505. In addition, controlling circuit 506 can include input current detection circuit 501, current detection circuit 502, constant output current controlling circuit 503, and logic and driving circuit 504.

Pin IN can be coupled to a first power terminal (e.g., source) of main power switch $Q_T$ to receive external input voltage $V_{in}$ to provide a voltage supply to switching regulator 500. Pin GND can be coupled to a second power terminal (e.g., source) of synchronous power switch $Q_B$ and to ground. Pin LX can be coupled to a common node of main power switch $Q_T$ and synchronous power switch $Q_B$, as well as to inductor $L_{out}$, which can connect to capacitor $C_{out}$.

Current detection circuit 502 can receive a signal that represents input current $I_{in}$ from pin IN to generate an output signal that is in direct proportion with output current $I_{out}$. Any available current detection circuits can be utilized in particular embodiments, such as the example current detection circuits shown in FIG. 2A and FIG. 3. For example, input current can be obtained by input current detection circuit 501, which can be implemented in any suitable way (e.g., e.g., a sensing resistor, a hall current sensor, etc.) in particular embodiments.

Constant output current controlling circuit 503 can generate a controlling signal with a corresponding duty cycle in accordance with an error between the received output signal, representative of output current $I_{out}$, and reference signal $I_{REF}$, representative of the expected output current of switching regulator 500. Logic and driving circuit 504 can receive controlling signal $V_{ctrl}$, and may generate driving signal $T_G$ to drive main power switch $Q_T$, as well as driving signal $B_G$ to drive synchronous power switch $Q_B$. Main power switch $Q_T$ and synchronous power switch $Q_B$ can be turned on and off periodically (e.g., via PWM control) to control the inductor current flowing through inductor $L_{out}$ to substantially maintain output current $I_{out}$ of the switching regulator as substantially consistent with expected output current $I_{REF}$.

In the particular example switching regulator of FIG. 5, because output current $I_{out}$ may not be sampled directly, no independent periphery circuits may be needed to sample the output current and no independent pin may be needed to receive the output current. The input current information of the switching regulator in FIG. 5 can be obtained directly by pin IN, and then the output current information can be obtained by the current detection circuit. This configuration can thus utilize fewer chip pins, may have a decreased chip area, simplified circuit configuration, higher reliability, and maximized monolithic integration, while also potentially simplifying associated peripheral circuitry.

In one embodiment, a switching regulator can include: (i) an output current detection circuit coupled to an output of a power stage of the switching regulator, and configured to obtain an output current of the switching regulator; (ii) a current detection circuit configured to receive the output current, and to generate a detection signal that is in direct proportion with an input current of the switching regulator; (iii) a constant output current controlling circuit configured to generate a current control signal based on the output current and a reference signal that represents an expected output current of the switching regulator; (iv) an input current limitation circuit configured to receive the detection signal and a current limitation signal, and to activate a limitation control signal when the input current is higher than the current limitation signal; and (v) a logic and driving circuit configured to drive power switches of the power stage in accordance with the current control signal to maintain the output current consistent with the expected output current, and to turn off the power switches in response to activation of the limitation control signal.

Figure 6:
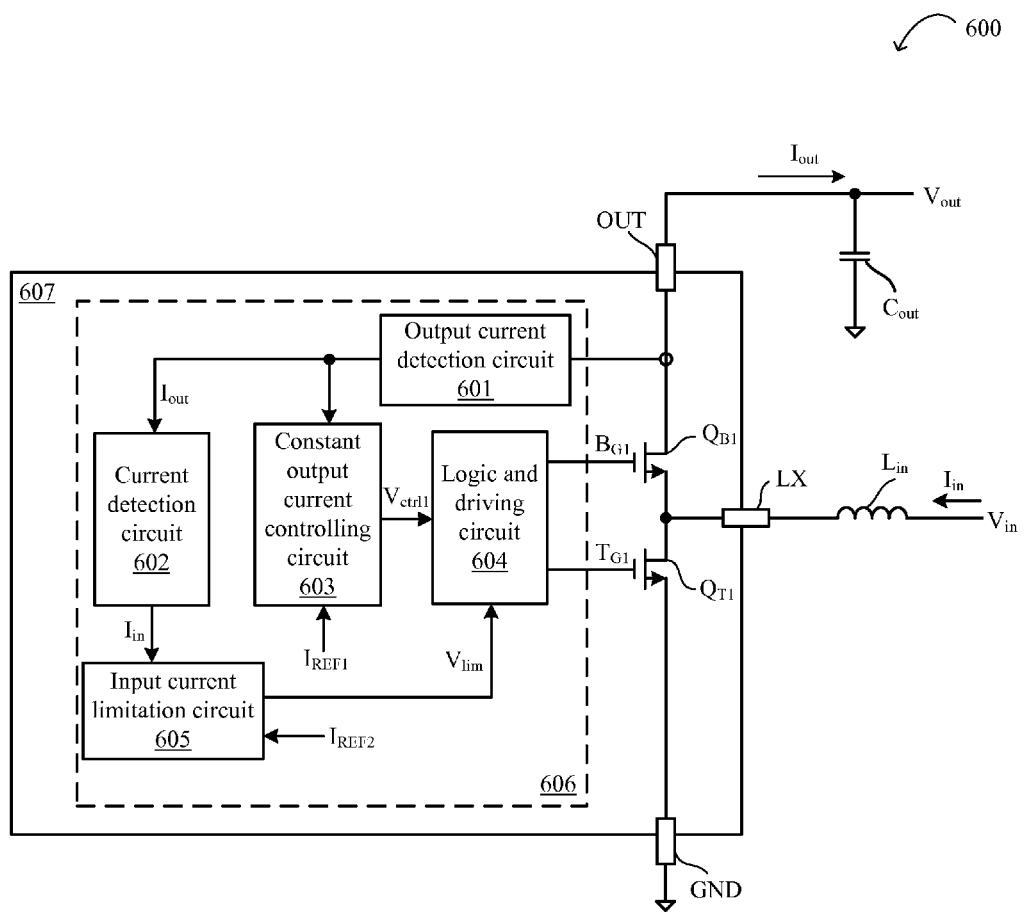
FIG. 6 is a schematic diagram of a second example switching regulator including an integrated circuit, in accordance with embodiments of the present invention.

Referring now to FIG. 6, shown is a schematic diagram of a second example switching regulator including an integrated circuit, in accordance with embodiments of the present invention. In this example, switching regulator 600 can be configured as a synchronous boost topology, and main power switch $Q_{T1}$, synchronous power switch $Q_{B1}$, input inductor $L_{in}$, and capacitor $C_{out1}$ can form a boost power stage. Controlling circuit 606 can include output current detection circuit 601, current detection circuit 602, constant output current controlling circuit 603, logic and driving circuit 604, and input current limitation circuit 605,.

For example, main power switch $Q_{T1}$, synchronous power switch $Q_{B1}$, and controlling circuit 606 may be integrated into single chip 607. Chip 607 can include pin LX, pin GND, and pin OUT for external connections. Input voltage $V_{in}$ of the regulator can essentially be transferred to a common node of main power switch $Q_{T1}$ and synchronous power switch $Q_{B1}$ through input inductor $L_{in}$ and pin LX. Pin OUT can be coupled to a load at output capacitor $C_{out}$, and pin GND can be coupled to ground. Also, output current detection circuit 601 may be coupled to pin OUT to sample the current of pin OUT to generate a signal (e.g., $I_{out}$) representative of the output current of switching regulator 600.

Current detection circuit 602 can receive a signal representative of output current $I_{out}$ to generate a signal representative of the input current (e.g., a detection signal in direct proportion with input current $I_{in}$. Input current limitation circuit 605 can generate limitation control signal $V_{lim}$ based on a comparison between the signal representative of the input current (e.g., $I_{in}$) and a current limitation signal (e.g., $I_{REF2}$). Constant output current controlling circuit 603 can generate controlling signal $V_{ctrl}$ based on an error between the signal representative of the output current (e.g., $I_{out}$) and reference signal $I_{REF1}$ that may represent an expected output current.

Logic and driving circuit 604 can be coupled to constant output current controlling circuit 603 and input current limitation circuit 605 to generate driving signal $T_{G1}$ to drive main power switch $Q_{T1}$, as well as driving signal $B_{G1}$ to drive synchronous power switch $Q_{B1}$ based on controlling signal $V_{ctrl}$. In this way, the output current can be maintained as substantially consistent with the expected output current (e.g., $I_{REF1}$) of switching regulator 600. Further, when input current $I_{in}$ is higher than current limit $I_{REF2}$, main power switch $Q_{T1}$ of the power stage can be turned off.

The embodiments were chosen and described in order to best explain the principles of the invention and its practical applications, to thereby enable others skilled in the art to best utilise the invention and various embodiments with modifications as are suited to the particular use contemplated. It is intended that the scope of the invention be defined by the claims appended hereto and their equivalents.

What is claimed is:

1. A current detection circuit configured for a switching regulator, the current detection circuit comprising:
   a feedback controlling circuit configured to control a feedback signal to be consistent with a reference signal, and to generate a feedback control signal; and
   a feedback signal generator configured to receive a rise time and a fall time of inductor current of said switching regulator, and to generate said feedback signal in direct proportion with said feedback control signal, wherein said feedback signal generator comprises a switching circuit having first and second switches coupled in series between said feedback control signal and ground, and a filtering circuit having a filtering resistor and a filtering capacitor coupled in series between a common node of said first and second switches and ground, said feedback signal being configured as an output on a common node of said filtering resistor and said filtering capacitor.

2. The current detection circuit of claim 1, wherein:
   said reference signal is in direct proportion with an input current of said switching regulator; and
   said feedback control signal is in direct proportion with an output current of said switching regulator.

3. The current detection circuit of claim 1, wherein during each switching cycle:
   an on time of said first switch is consistent with said rise time of said inductor current; and
   an on time of said second switch is consistent with said fall time of said inductor current.

4. The current detection circuit of claim 1, wherein during each switching cycle:
   an on time of said first switch is consistent with said fall time of said inductor current; and
   an on time of said second switch is consistent with said rise time of said inductor current.

5. The current detection circuit of claim 1, wherein said feedback signal generator further comprises a third switch coupled between said filtering resistor and said filtering capacitor, and wherein an on time of said third switch comprises a remaining time of said switching cycle excluding said rise and fall times.

6. The current detection circuit of claim 1, wherein said feedback controlling circuit comprises an operational amplifier configured to receive said feedback signal and said reference signal, and to generate said feedback control signal.

7. The current detection circuit of claim 1, wherein said feedback controlling circuit comprises:
   a transconductance amplifier configured to receive said feedback signal and said reference signal; and
   a charging capacitor coupled to an output of said transconductance amplifier, wherein a voltage across said charging capacitor is configured as said feedback control signal.

8. A current detection circuit configured for a switching regulator, the current detection circuit comprising:
   a feedback controlling circuit configured to control a feedback signal to be consistent with a reference signal, and to generate a feedback control signal;
   a feedback signal generator configured to receive a rise time and a fall time of inductor current of said switching regulator, and to generate said feedback signal in direct proportion with said feedback control signal;
   a comparator configured to receive said feedback signal and said reference signal;
   a first switching circuit comprising first and second switches coupled in series between a voltage source and ground, wherein said first switch is controllable by an output of said comparator, and said second switch is controllable by an inverted version of said comparator output; and
   a first charging capacitor coupled to a common node of said first and second switches, wherein a voltage across said first charging capacitor is configured as said feedback control signal.

9. The current detection circuit of claim 1, wherein said switching regulator comprises a non-synchronous topology.

10. The current detection circuit of claim 1, wherein said switching regulator comprises a synchronous topology.

11. The current detection circuit of claim 1, wherein said switching regulator is configured to be operated in a continuous inductor current mode.

12. The current detection circuit of claim 1, wherein said switching regulator is configured to be operated in a discontinuous inductor current mode.

13. The current detection circuit of claim 1, wherein said switching regulator is configured to be operated in a boundary inductor current mode.

14. The current detection circuit of claim 8, wherein:
   said reference signal is in direct proportion with an input current of said switching regulator; and
   said feedback control signal is in direct proportion with an output current of said switching regulator.

15. The current detection circuit of claim 8, wherein said feedback signal generator comprises:

a second switching circuit having third and fourth switches coupled in series between said feedback control signal and ground; and a filtering circuit having a filtering resistor and a filtering capacitor coupled in series between a common node of said third and fourth switches and ground, wherein said feedback signal is configured as an output on a common node of said filtering resistor and said filtering capacitor.

16. The current detection circuit of claim 15, wherein during each switching cycle:

an on time of said third switch is consistent with said rise time of said inductor current; and an on time of said fourth switch is consistent with said fall time of said inductor current.

17. The current detection circuit of claim 15, wherein during each switching cycle:

an on time of said third switch is consistent with said fall time of said inductor current; and an on time of said fourth switch is consistent with said rise time of said inductor current.

18. The current detection circuit of claim 15, wherein said feedback signal generator further comprises a fifth switch coupled between said filtering resistor and said filtering capacitor, and wherein an on time of said fifth switch comprises a remaining time of said switching cycle excluding said rise and fall times.

19. The current detection circuit of claim 8, wherein said feedback controlling circuit comprises an operational amplifier configured to receive said feedback signal and said reference signal, and to generate said feedback control signal.

20. The current detection circuit of claim 8, wherein said feedback controlling circuit comprises:

a transconductance amplifier configured to receive said feedback signal and said reference signal; and a second charging capacitor coupled to an output of said transconductance amplifier, wherein a voltage across said second charging capacitor is configured as said feedback control signal.

* * * * *